United States Patent [19]

Hasegawa

[11] Patent Number: 6,020,835
[45] Date of Patent: Feb. 1, 2000

[54] CODE DECODING APPARATUS

[75] Inventor: Koichi Hasegawa, Kanagawa, Japan

[73] Assignee: Sony Corporation, Japan

[21] Appl. No.: 09/232,694

[22] Filed: Jan. 19, 1999

[30] Foreign Application Priority Data

Jan. 22, 1998 [JP] Japan ................................. P10-010254

[51] Int. Cl.[7] .................................................. H03M 7/40
[52] U.S. Cl. ............................................................. 341/67
[58] Field of Search ................................. 341/67, 59, 51, 341/106

[56] References Cited

U.S. PATENT DOCUMENTS 5,929,793  7/1999  Choi ........................................... 341/67
5,933,536  8/1999  Fukuzawa ................................ 382/246
5,940,017  8/1999  Jeon ........................................... 341/67

Primary Examiner—Brian Young
Attorney, Agent, or Firm—Rader, Fishman & Grauer; Ronald P. Kananen

[57] ABSTRACT

A code decoding apparatus for converting a signal sequence having a variable length code, a fixed length code, and a specifically fixed length code into other equivalent codes, a synchronizing process and a syntax analyzing process being performed corresponding to the specifically fixed length code. The decoding apparatus includes a correlating unit for detecting a specifically fixed length code from the signal sequence, a distributing means for successively distributing the signal sequence preceded by the detected specifically fixed length code to a plurality of code decoding units, and a decoding means for causing the code decoding units to decode the signal sequence.

7 Claims, 14 Drawing Sheets

CODE DECODING APPARATUS

BACKGROUND OF THE INVENTION

1. Field of the Invention

The present invention relates to a code decoding apparatus, suitable for use in a communicating apparatus, a broadcasting apparatus, or an information apparatus, that performs a signal compressing process using a variable length code corresponding to a standard such as MPEG (Moving Picture Experts Group), JPEG (Joint Photographic Coding Experts Group), or the like.

2. Description of the Related Art

Recently, as digital signal processing technologies have advanced, many communication apparatuses, broadcasting apparatuses, and information apparatuses that are small and have high quality have been developed. In these devices, a signal compressing process is performed with variable length codes so as to compress the data of images, voice, and information.

Before explaining a conventional code decoding apparatus, with reference to FIG. 1, a signal sequence encoded with a variable length code will be briefly described. A signal sequence encoded with a variable length code is composed of a fixed length code 72, a specifically fixed length code 73, and a variable length code 74. Assuming that the entire code set is denoted by reference numeral 71, the relationship among the fixed length code 72, the specifically fixed code 73, and the variable length code 74 is shown in FIG. 1.

As shown in FIG. 1, the specifically fixed length code 73 is a part of the fixed length code 72. The specifically fixed length code 73 is independent from other codes. An unknown signal sequence can be uniquely detected by correlating it with a known specifically fixed length code. Thus, the specifically fixed length code 73 is mainly used for a synchronizing process and a syntax analyzing process. In addition, the variable length code 74 is a code based on a variable length encoding theorem. Since the code length of the variable length code 74 is variable, information can be compressed.

FIGS. 2 and 3 show an example of the structure of a conventional code decoding apparatus. FIG. 3 shows an example of the structure of a decoding unit shown in FIG. 2. In FIG. 3, similar portions to those in FIG. 2 are denoted by similar reference numerals. An encoded signal sequence received from a communication apparatus, a broadcasting apparatus, a storing medium, or the like is input to a buffer memory 75 through an input terminal 1. The encoded signal sequence that has been successively input is written to the buffer memory 75. When the buffer memory 75 has stored the encoded signal sequence for a predetermined time period or stored a predetermined amount of the signal sequence, the buffer memory 75 supplies the encoded signal sequence to a decoding unit 76. The decoding unit 76 decodes the encoded signal sequence. The decoded signal sequence is obtained from an output terminal 99. In other words, the system shown in FIG. 2 varies a decoding speed while the transmission rate of a signal sequence received from a communication path or a storing unit is being kept constant.

The encoded signal sequence that is read from the buffer memory 75 is supplied to a correlating unit 77, a fixed length code reading unit 78, and a variable length code decoder 79 that compose the decoding unit 76 shown in FIG. 3. The correlating unit 77 detects a specifically fixed length code and generates control information from the detected specifically fixed length code. The control information is used for performing a synchronizing process and a syntax analyzing process. The control information generated by the correlating unit 77 is supplied to a sequencer 80.

A fixed length code is read by the fixed length code reading unit 78. The fixed length code reading unit 78 directly outputs the fixed length code. When necessary, the fixed length code reading unit 78 converts the fixed length code into another code. The output signal of the fixed length code reading unit 78 is supplied to one input terminal of a selector 81.

A variable length code is read by the variable length code decoding unit 79. The variable length code decoder 79 converts the variable length code to another equivalent code. In other words, the variable length code decoding unit 79 finds a set of a known variable length code group corresponding to an unknown signal, selects another code (for example, a fixed length code) with the code length corresponding to the variable length code, discards a signal for the code length of the unknown signal sequence, and outputs another equivalent code to the next stage. For the unknown signal sequence, the process for fining a set of a known variable length code group is repeated a number of times corresponding to predetermined syntax or until a specifically fixed length code is detected. The resultant signal is supplied to the other input terminal of the selector 81.

The sequencer 80 controls the selector 81 with the control information corresponding to syntax received from the correlating unit 77 so as to select an output signal of the fixed length code reading unit 78 or a decoded output signal of the variable length code decoding unit 79. An output signal of the selector 81 is obtained through an output terminal 83. At this point, a synchronization signal formed by the sequencer 80 is obtained through an output terminal 82.

The synchronization signal and the decoded signal are supplied to a processing unit on the next stage through the output terminal 82 and the output terminal 83, respectively. The processing unit on the next stage is composed of for example a microprocessor. The synchronization signal causes the microprocessor to synchronize and perform a predetermined process for the decoded signal.

The circuit portion that requires the highest processing capability in the above-described conventional code decoding apparatus is the variable length code decoding unit 79 that finds a set corresponding to a given signal sequence from a known variable length code group.

A sequence in operations of which the variable length code decoding unit 79 finds a particular variable length code from an encoded signal sequence and discards a signal for the length of the code length of the variable length code from the signal sequence depends on the preceding decoded result because the code length is variable. Thus, a parallel operation or a pipeline operation cannot be used for the variable length code decoding unit 79. Consequently, the operation speed and the process capability of the entire circuit depend on the total time necessary for each sequential process of the variable length code decoding unit 79.

Thus, to cause the conventional code decoding apparatus to speed up, the variable length code decoding unit should be formed of wired logic and ROM. In addition, redundant portions should be satisfactorily removed so as to shorten the operation time for each sequential process.

However, when wired logic and ROM are used, a general-purpose variable length code decoding unit cannot be provided. Thus, a variable length code decoder should be de designed for each new code. Even if the variable length code decoding unit operates at high speed, its speed is lower than a circuit that operates in parallel or in pipeline.

OBJECTS AND SUMMARY OF THE INVENTION

Therefore, an object of the present invention is to accomplish a circuit that operates in parallel and in pipeline and to provide a general-purpose code decoding apparatus that operates at very high speed.

A first aspect of the present invention is a code decoding apparatus for converting a signal sequence having a variable length code, a fixed length code, and a specifically fixed length code into other equivalent codes, a synchronizing process and a syntax analyzing process being performed corresponding to the specifically fixed length code, the apparatus comprising a correlating unit for detecting a specifically fixed length code from the signal sequence, a distributing means for successively distributing the signal sequence preceded by the detected specifically fixed length code to a plurality of code decoding units, and a decoding means for causing the code decoding units to decode the signal sequence.

A second aspect of the present invention is a code decoding apparatus for temporarily writing a signal sequence having a variable length code, a fixed length code, and a specifically fixed length code to a buffer memory, reading a signal sequence from the buffer memory, and converting the signal sequence into another equivalent codes, a synchronizing process and a syntax analyzing process being performed corresponding to the specifically fixed length code, the apparatus comprising a detecting means for detecting a specifically fixed length code from the signal sequence, a plurality of discrete buffer memories, a selecting means for selecting a particular one of the plurality of discrete buffer memories, and a writing means for writing the signal sequence to the selected discrete buffer memory until the next specifically fixed length code is detected.

A third aspect of the present invention is a code decoding apparatus for receiving a signal sequence composed of a block group of one screen, blocks of the block group being horizontally or vertically successive, a specifically fixed length code, a fixed length code representing the horizontal or vertical position of the first block, and pixel data of a plurality of blocks being encoded with variable length codes, the apparatus comprising a correlating unit for detecting a specifically fixed length code from the signal sequence, a reading means for reading the value of a fixed length code representing the horizontal position or the vertical position of the first block of the successive blocks, a plurality of discrete buffer memories, a selecting means for selecting a particular discrete buffer memory from the plurality of discrete buffer memories corresponding to the horizontal position or the vertical position of the block that is read by the reading means, and a writing means for writing a signal sequence to the selected discrete buffer memory until the next specifically fixed length code is detected.

According to the present invention, an encoded signal sequence is delimited with specifically fixed length codes as a plurality of signal sequences by a pre-processing unit. The resultant signal sequences are written to a plurality of discrete buffer memories. Thus, with respect to a variable length code of a signal sequence written to each discrete buffer memory, sequential processes depending on the result of the preceding process are performed as with the conventional code decoding apparatus. However, variable length codes of signal sequences written to the individual discrete buffer memories are independent from each other. Thus, when the plurality of discrete buffer memories are selected in succession, variable length codes of signal sequences that are separately read are independent from each other. Consequently, the variable length code decoding unit can be operated in parallel or in pipeline. As a result, the circuit can be easily operated at high speed.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Figure 1:
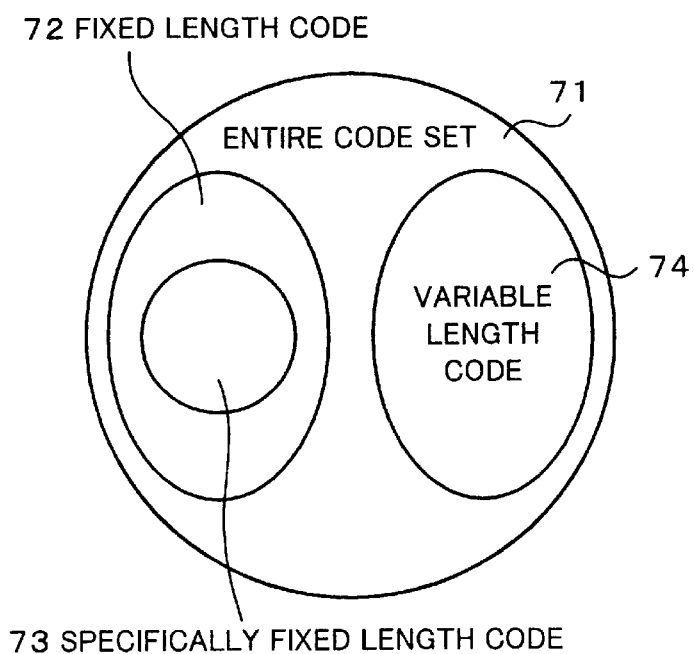
FIG. 1 is a schematic diagram for explaining codes.
Figure 2:
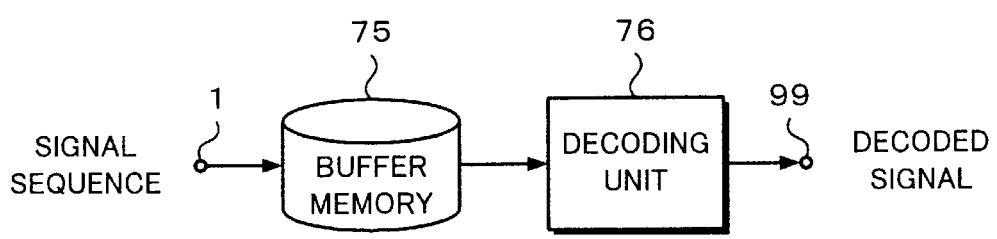
FIG. 2 is a block diagram showing an example of the structure of a conventional code decoding apparatus.
Figure 3:
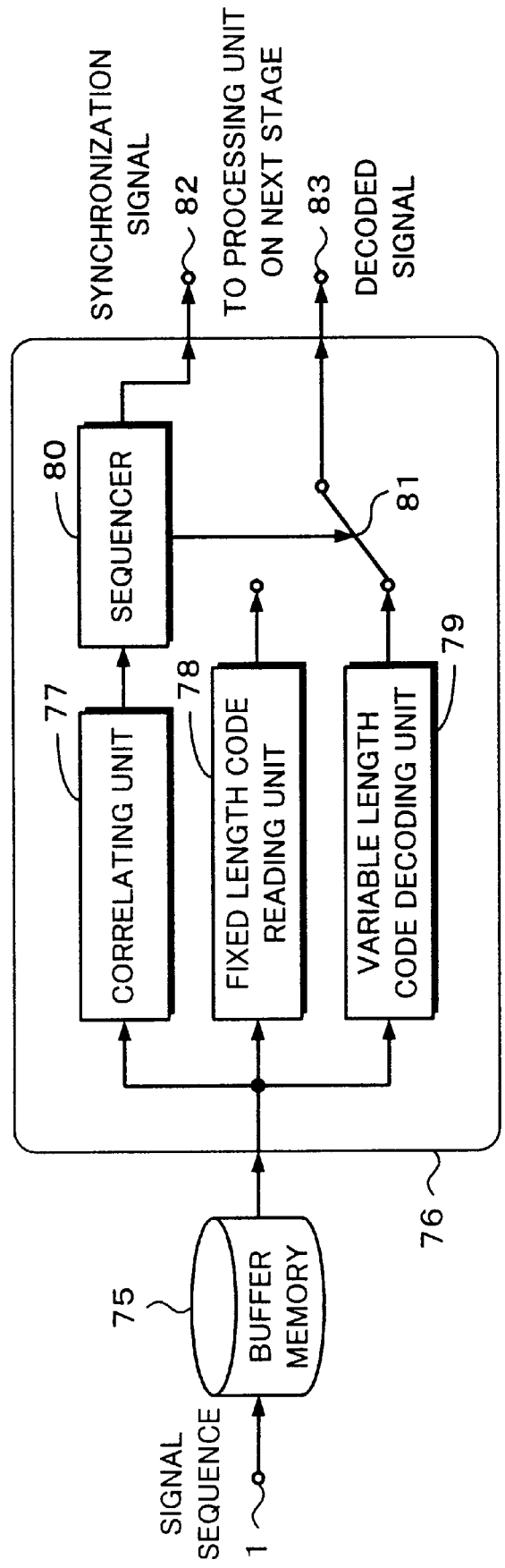
FIG. 3 is a block diagram showing an example of the structure of a conventional code decoding apparatus.
Figure 4:
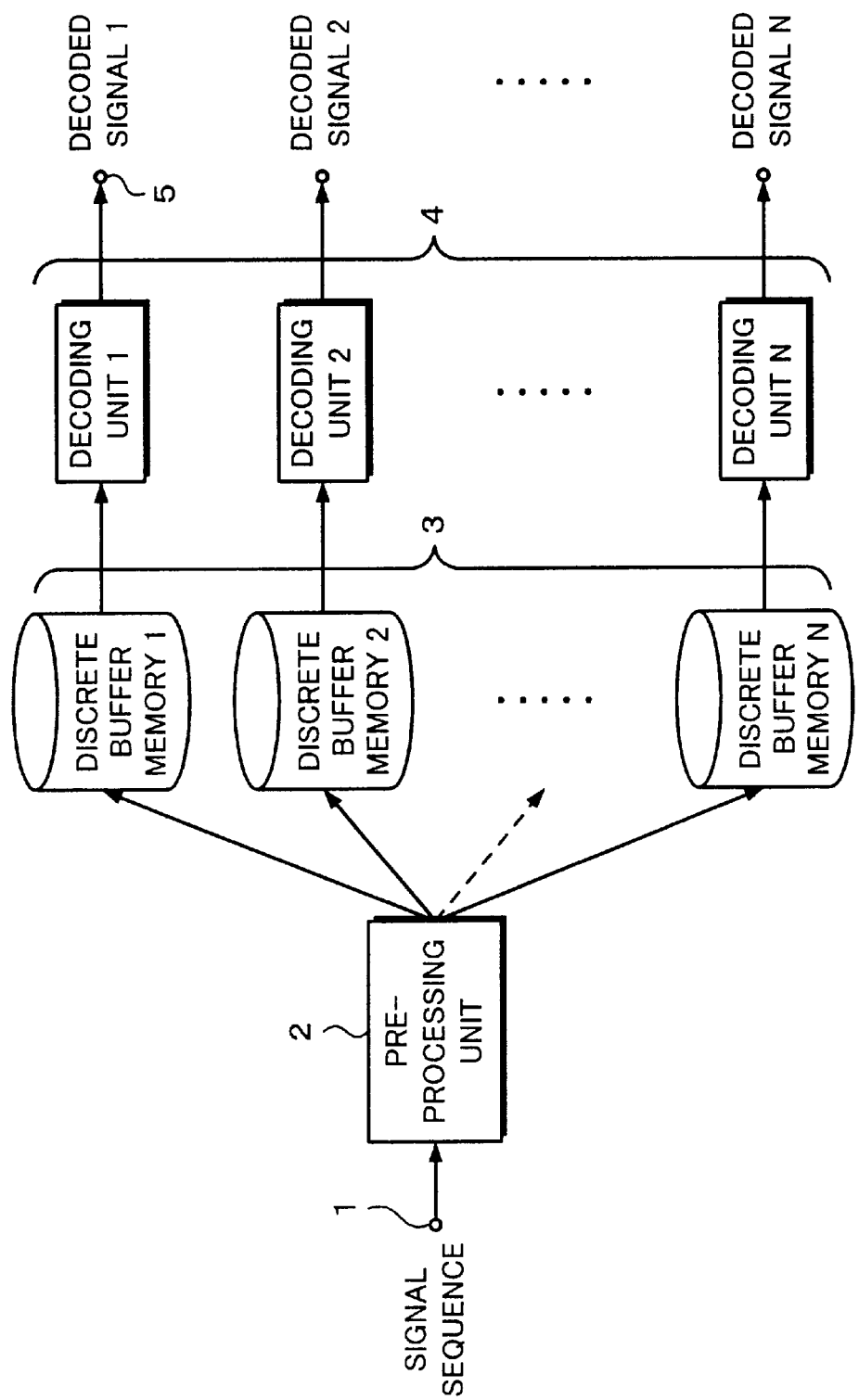
FIG. 4 is a block diagram showing the overall structure of a first embodiment of the present invention.
Figure 5:
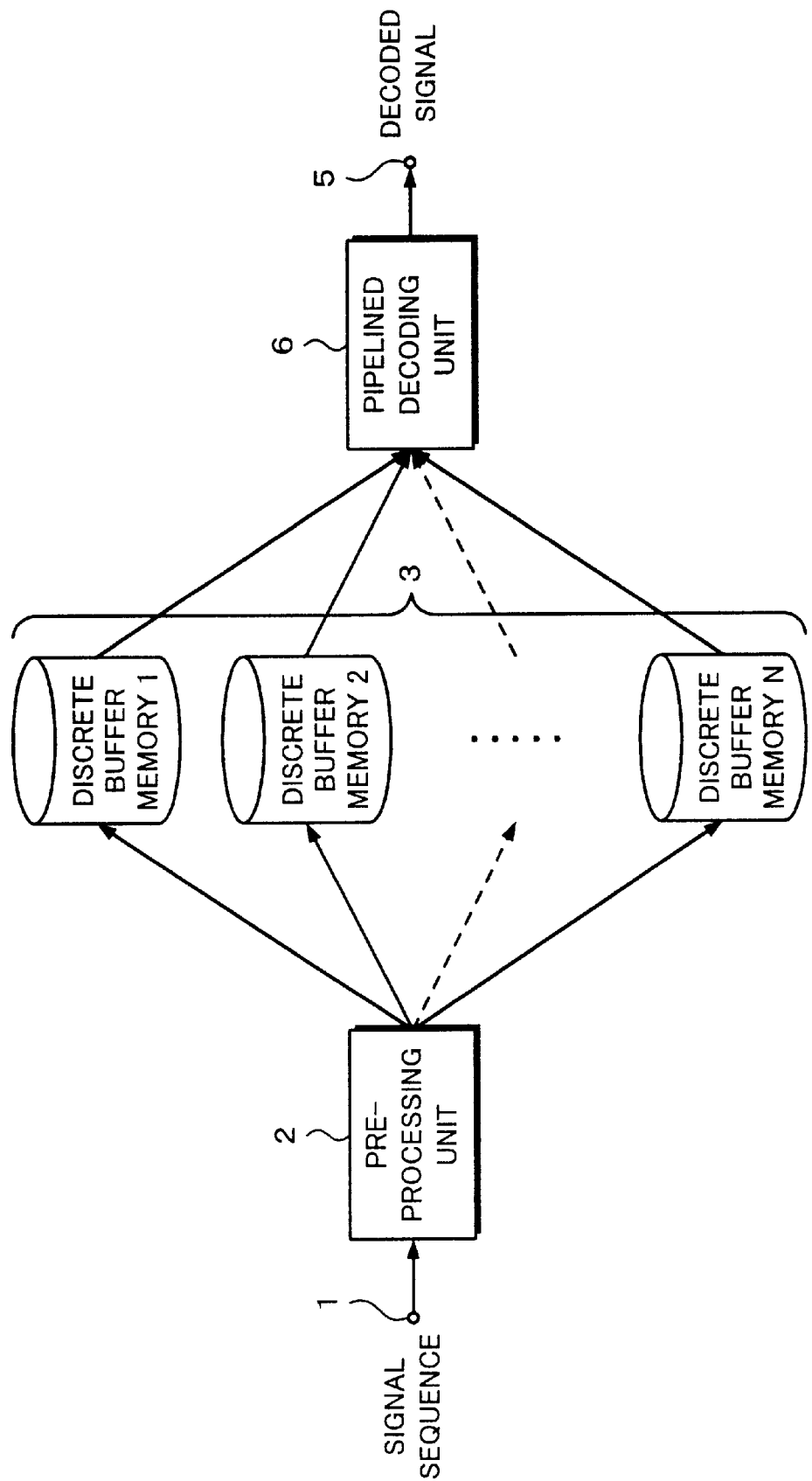
FIG. 5 is a block diagram showing the overall structure of a second embodiment of the present invention.
Figure 6:
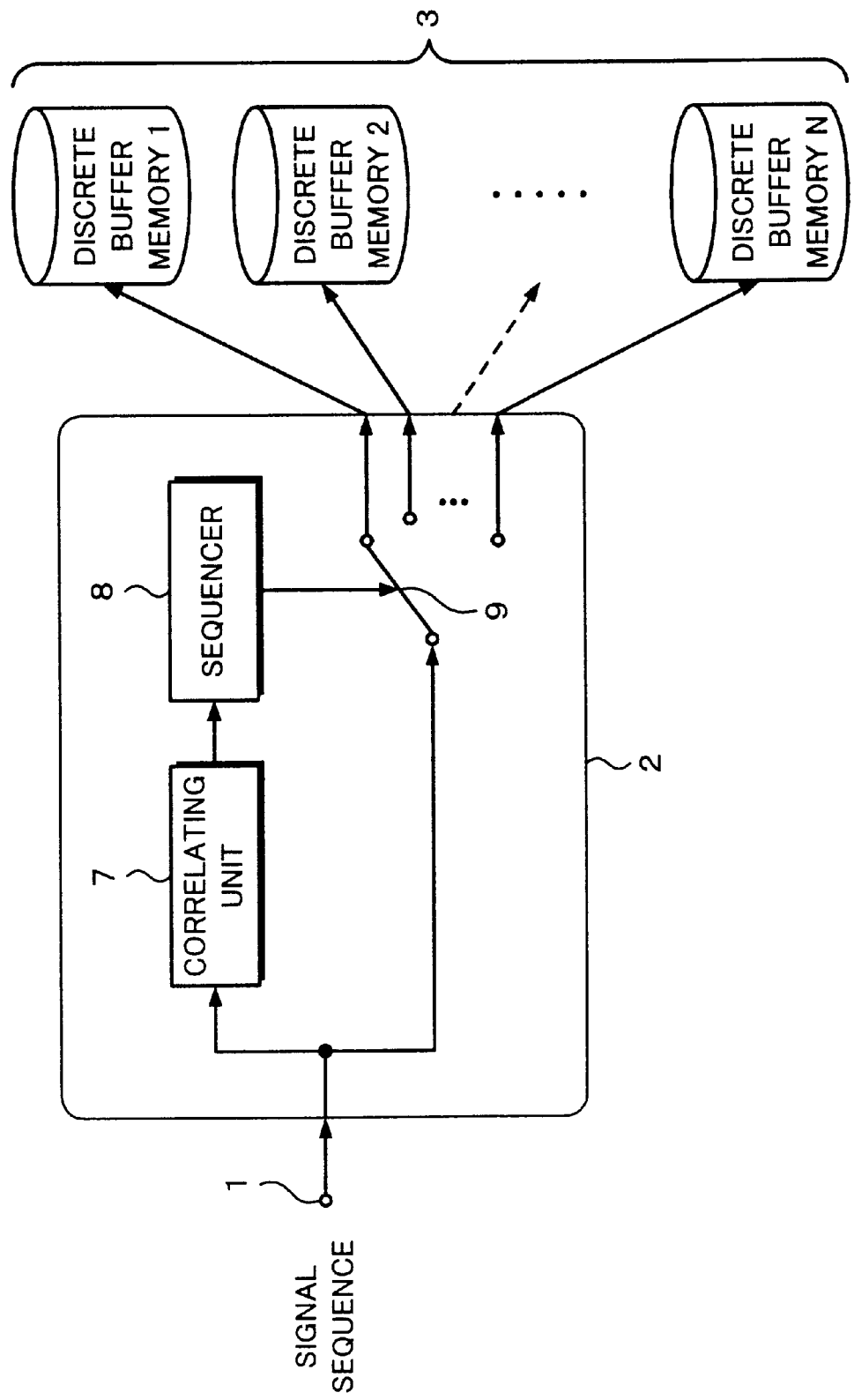
FIG. 6 is a block diagram showing an example of the structure of a pre-processing unit according to the present invention.

Next, with reference to FIGS. 4, 5, 6, 7, 8, and 9, a first embodiment and a second embodiment of the present invention will be described. FIG. 4 shows the overall structure of the first embodiment of the present invention. FIG. 5 shows the overall structure of the second embodiment of the present invention. FIG. 6 shows the structure of a pre-processing unit 2 shown in FIGS. 4 and 5. In FIGS. 4, 5, and 6, similar portions are denoted by similar reference numerals.

An encoded signal sequence received from a communications apparatus, a broadcasting apparatus, a storing medium, or the like is supplied to a pre-processing unit 2 through an input terminal 1. The encoded signal sequence supplied to the input terminal 1 contains a variable length code and a specifically fixed length code. The specifically fixed length code is used for performing a synchronizing process and a syntax analyzing process. The specifically fixed length code is independent from any other codes. An unknown signal sequence can be uniquely detected by correlating it with a known specifically fixed length code.

As shown in FIG. 6, the pre-processing unit 2 is composed of a correlating unit 7, a sequencer 8, and a selector 9. The encoded signal sequence received from the input terminal 1 is supplied to the correlating unit 7 and an input terminal of the selector 9. The correlating unit 7 detects a specifically fixed length code and generates control information (that is used for performing a synchronizing process and a syntax analyzing process) corresponding to the detected specifically fixed length code. The control information generated by the correlating unit 7 is supplied to the sequencer 8.

The sequencer 8 controls the selector 9 to select N buffer memories of a memory portion 3 and write the signal sequence preceded by the detected specifically fixed length code thereto so that the processing amounts of the signal sequence preceded by the detected specifically fixed length code are equally distributed. The distributed signal subsequences are read from the memory portion 3 after a predetermined time period elapses or when the total capacity of signal sequences stored in the N discrete buffer memories exceeds a predetermined capacity. In the first embodiment, as shown in FIG. 4, the N signal sequences that are read from the N buffer memories of the memory portion 3 are supplied to N decoding units of a decoding portion 4. Alternatively, in the second embodiment, as shown in FIG. 5, the N signal sequences are supplied to a pipelined decoding unit 6.

Since the pre-processing unit 2 does not add information to the signal sequence at all, the total capacity of the memory portion 3 composed of the N buffer memories is equal to the capacity of the buffer memory of a conventional code decoding apparatus.

A specifically fixed length code causes each of the N decoding units of the decoding portion 4 to perform a synchronizing process and a syntax analyzing process. Each of the N decoding units operates corresponding to predetermined syntax. In other words, a fixed length code is not converted. Alternatively, a fixed length code is converted into an equivalent code. On the other hand, a variable length code is converted into another equivalent code by a variable length code decoding unit (not shown). Decoded signals that are output from the decoding units of the decoding portion 4 are obtained through N output terminals 5 and supplied to the processing unit on the next stage.

Figure 7:
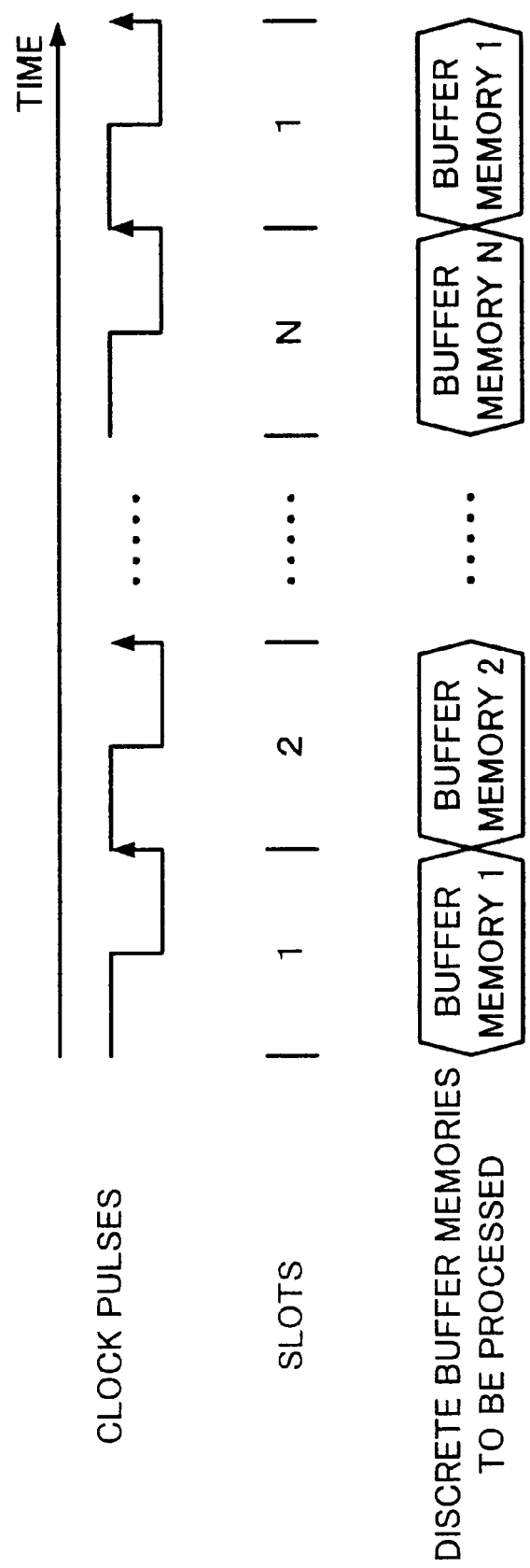
FIG. 7 is a timing chart for explaining operations of the first embodiment and the second embodiment of the present invention.

The pipelined decoder 6 decodes signal sequences received from the N buffer memories of the memory portion 3 in a series of predetermined time slots on a time division basis. FIG. 7 shows the relation between the N buffer memories and time slots on the time base. As shown in FIG. 7, time slots (1, 2, ... N) are equally assigned to the N buffer memories in synchronization with clock pulses. Thus, at the timings of the time slots, processing of data in the N buffer memories is successively performed.

Figure 8:
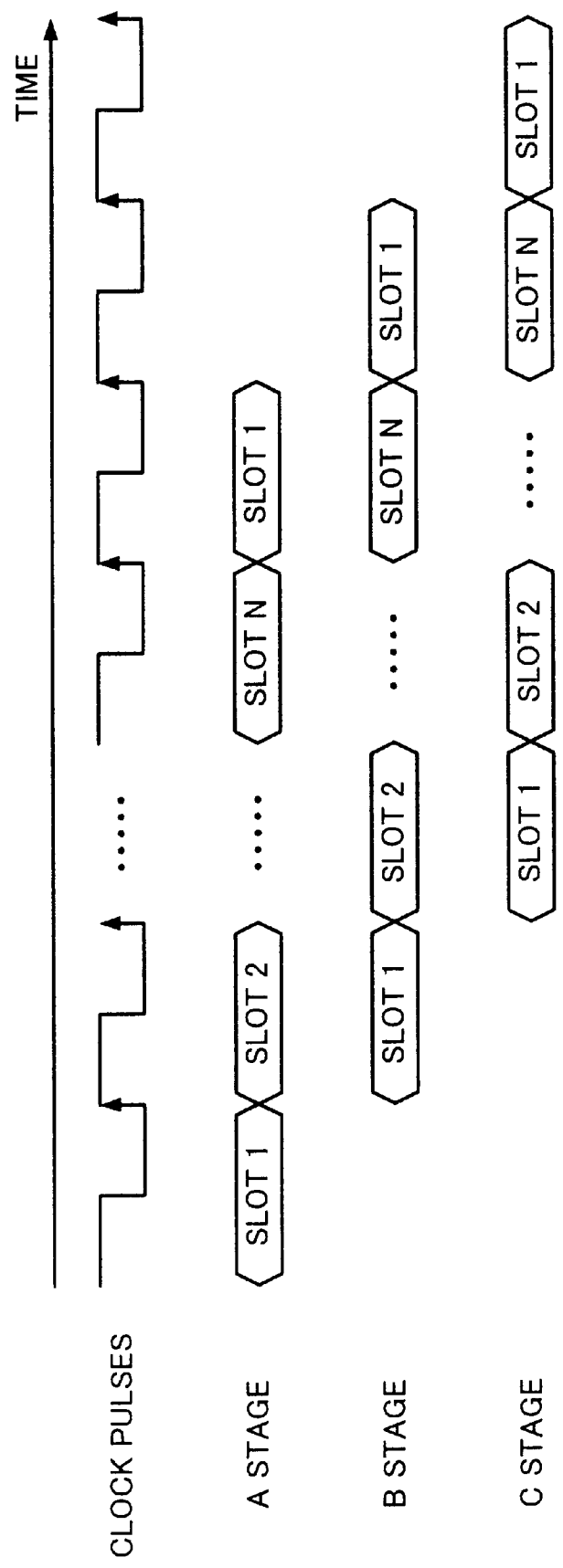
FIG. 8 is a timing chart for explaining operations of the first embodiment and the second embodiment of the present invention.
Figure 9:
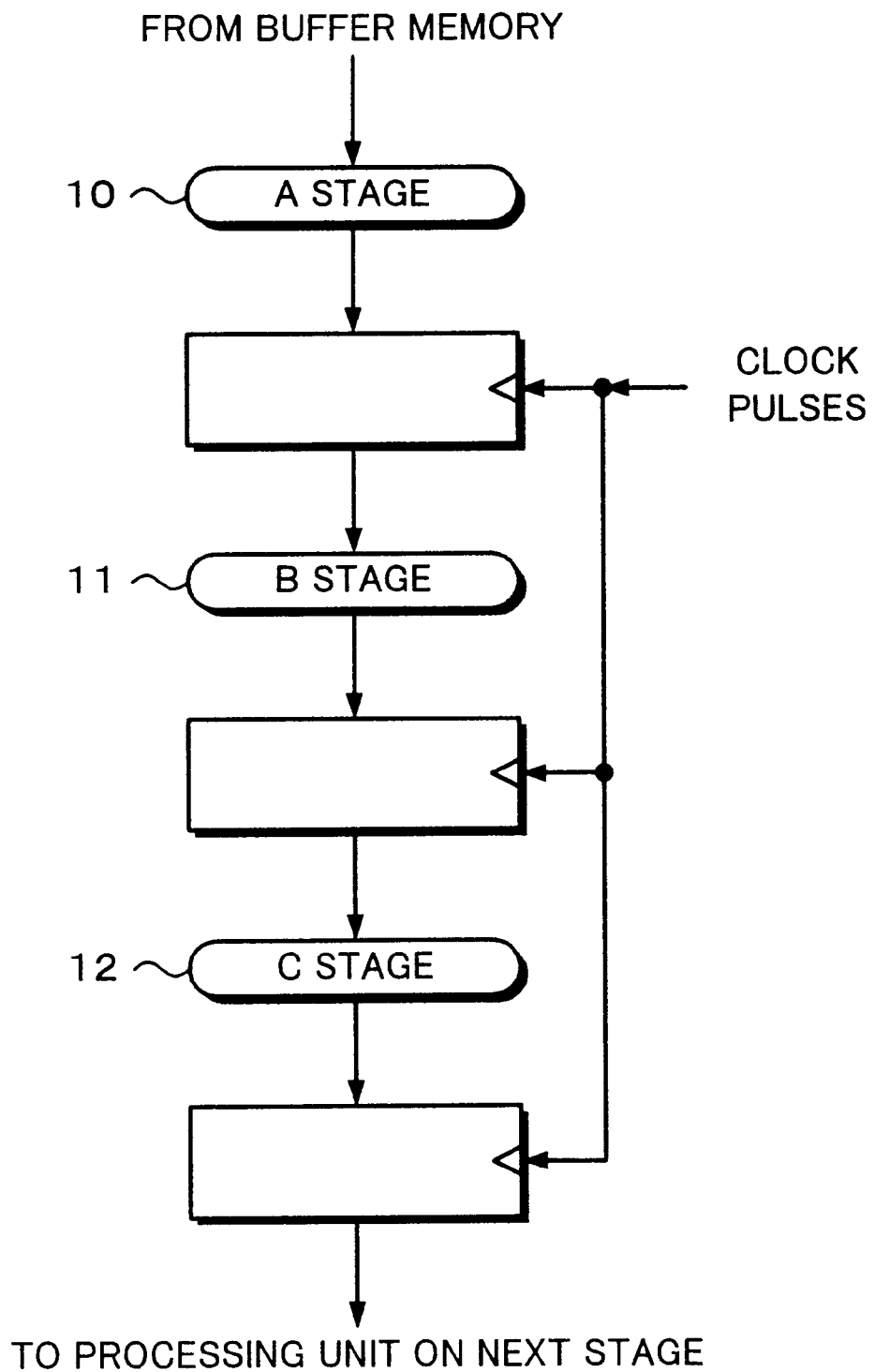
FIG. 9 is a timing chart for explaining operations of the first embodiment and the second embodiment of the present invention.

For example, processes of the pipelined decoding unit 6 are divided into three stages. By successively performing the processes on the three stages, the decoding process is completed. FIG. 8 shows the relationship between the processes performed by the pipelined decoding unit 6 on the data in the N buffer memories using time slots on a time base. FIG. 9 shows a flow of the processes of the pipelined decoding unit 6. As shown in FIG. 9, there are three stages, namely an A stage 10, a B stage 11, and a C stage 12. Registers are disposed between stages for the pipeline process. At a leading edge-of a clock signal supplied to a clock input terminal of each register, a signal sequence is successively supplied. Thus, data in each process is settled.

In other words, as shown in FIGS. 8 and 9, signal sequences are successively supplied corresponding to individual clock pulses. A process on the A stage 10 is followed by a process on the B stage 11. A process on the B stage 11 is followed by a process on the C stage 12. The pipeline is continuously filled with a signal sequence. On each stage, a signal sequence is processed corresponding to a timing of a time slot.

On the A stage, signal sequences are read from the N buffer memories. At this point, the signal sequences that are read from the buffer memories are not discarded. The signal sequences are discarded on the C stage 12.

On the B stage 11, a specifically fixed length code is detected. Corresponding to the detected specifically fixed length code, a synchronizing process and a syntax analyzing process are performed. When a specifically fixed length code is not detected, a variable length code is detected corresponding to syntax.

On the C stage 12, the detected code or another equivalent code is output to the processing unit on the next stage. The signal for the length of the detected code is discarded from the buffer memory.

By repeating the pipeline process composed of the A stage 10, the B stage 11, and the C stage 12, the decoding process is performed. The decoded output signal received from the pipelined decoding unit 6 is obtained through the output terminal 5 and supplied to the processing unit on the next stage. The number of stages of processes of the decoding unit 6 may be increased corresponding to the number of processes. Likewise, the processing unit on the next stage should process a plurality of decoded codes. In this case, a plurality of processes are used. Of course, a plurality of decoding units 6 may be pipelined.

Next, with reference to FIGS. 10, 11, 12, 13, 14, and 15, a code decoding apparatus according to the present invention will be described. In this case, the code decoding apparatus decodes a signal sequence carrying image information that has been compressed with a variable length code. In this case, the structure of the signal sequence is formed corresponding to a standard such as MPEG1-Video, MPEG2-Video, or JPEG.

Figure 10:
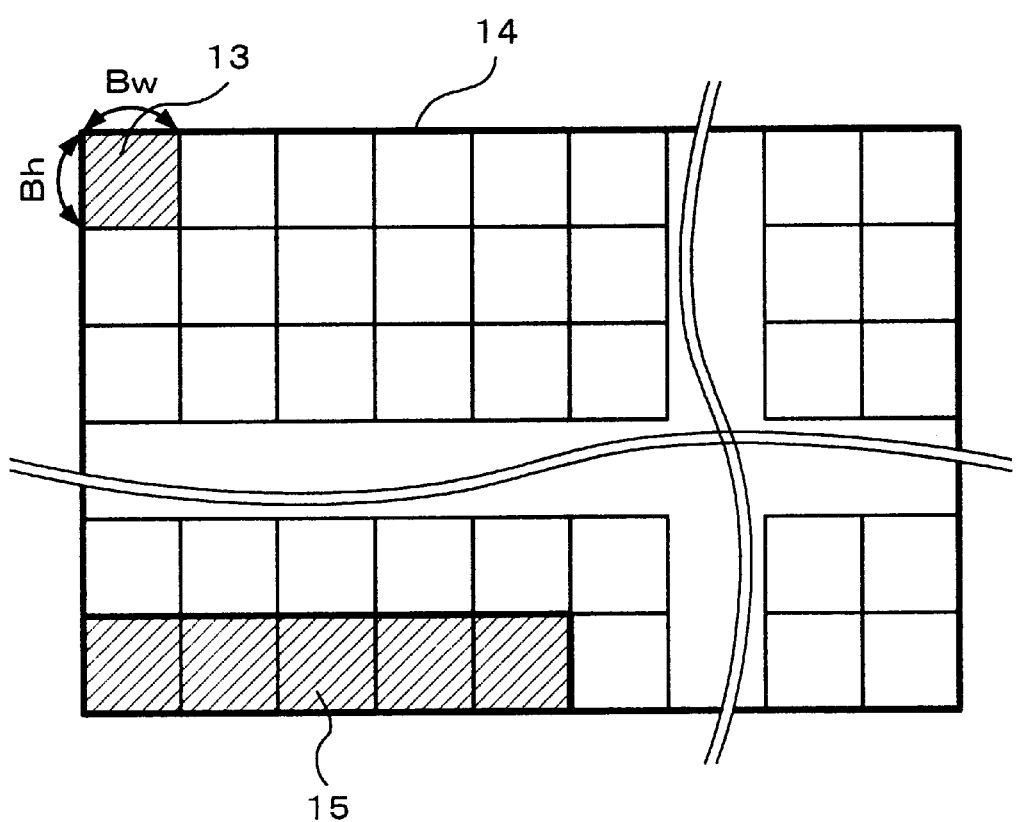
FIG. 10 is a schematic diagram for explaining a compressing process according to the present invention.

FIG. 10 shows a screen of information that is compressed. In FIG. 10, reference numeral 14 represents one screen. As shown in FIG. 10, the screen 14 is composed of a plurality of blocks each of which is composed of BwxBh pixels. A sequence of horizontal blocks is referred to as a slice 15.

Figure 11:
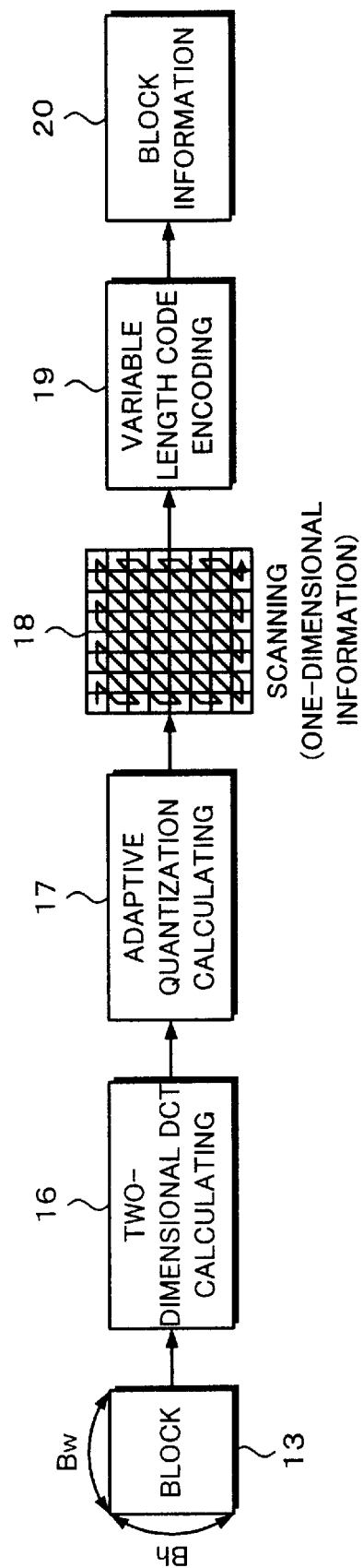
FIG. 11 is a schematic diagram for explaining an encoding process according to the present invention.

FIG. 11 shows an encoding process for block information of one block 13 that is a processing unit of the compressing process. As shown in FIG. 11, pixel information for each block 13 is converted into spatial frequency areas by a two-dimensional DCT 16 or the like. The information amount is decreased corresponding to a visual characteristic by an adaptive quantizing calculation 17 or the like. A scanning Portion 18 (for example, zig-zag scanning) scans frequency components from the lowest frequency and obtains first-dimensional information. A variable length code encoding portion 19 encodes the first-dimensional information and output block information 20.

Figure 12:
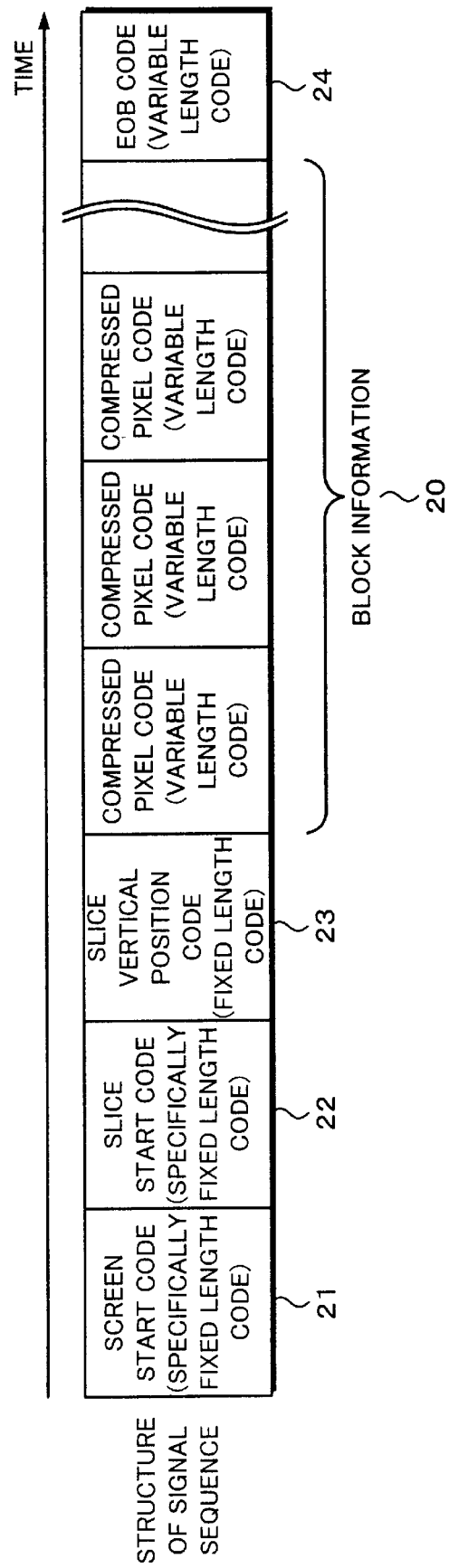
FIG. 12 is a schematic diagram for explaining an example of the structure of an encoded signal sequence according to the present invention.

FIG. 12 shows a practical structure of a signal sequence that has been encoded in the above-described manner. As shown in FIG. 9, the encoded signal sequence starts with a screen start code 21 as a specifically fixed length code that represents the start of a screen. The screen start code 21 is followed by a slice start code 22 as a specifically fixed length code that represents the start of the slice 15. The slice start code 22 is followed by a slice vertical position code 23 as a fixed length code that represents the vertical position of the slice 15 on the screen. The slice vertical position code 23 is followed by block information 20 composed of a plurality of compressed pixel codes. The block information 20 continues until an EOB (end of block) code is detected. In addition, the block information 20 continues to the next slice 15 as long as the block information 20 does not exceed the width of the screen. As another additional information, a fixed length code or the like (not shown) is added.

Figure 13:
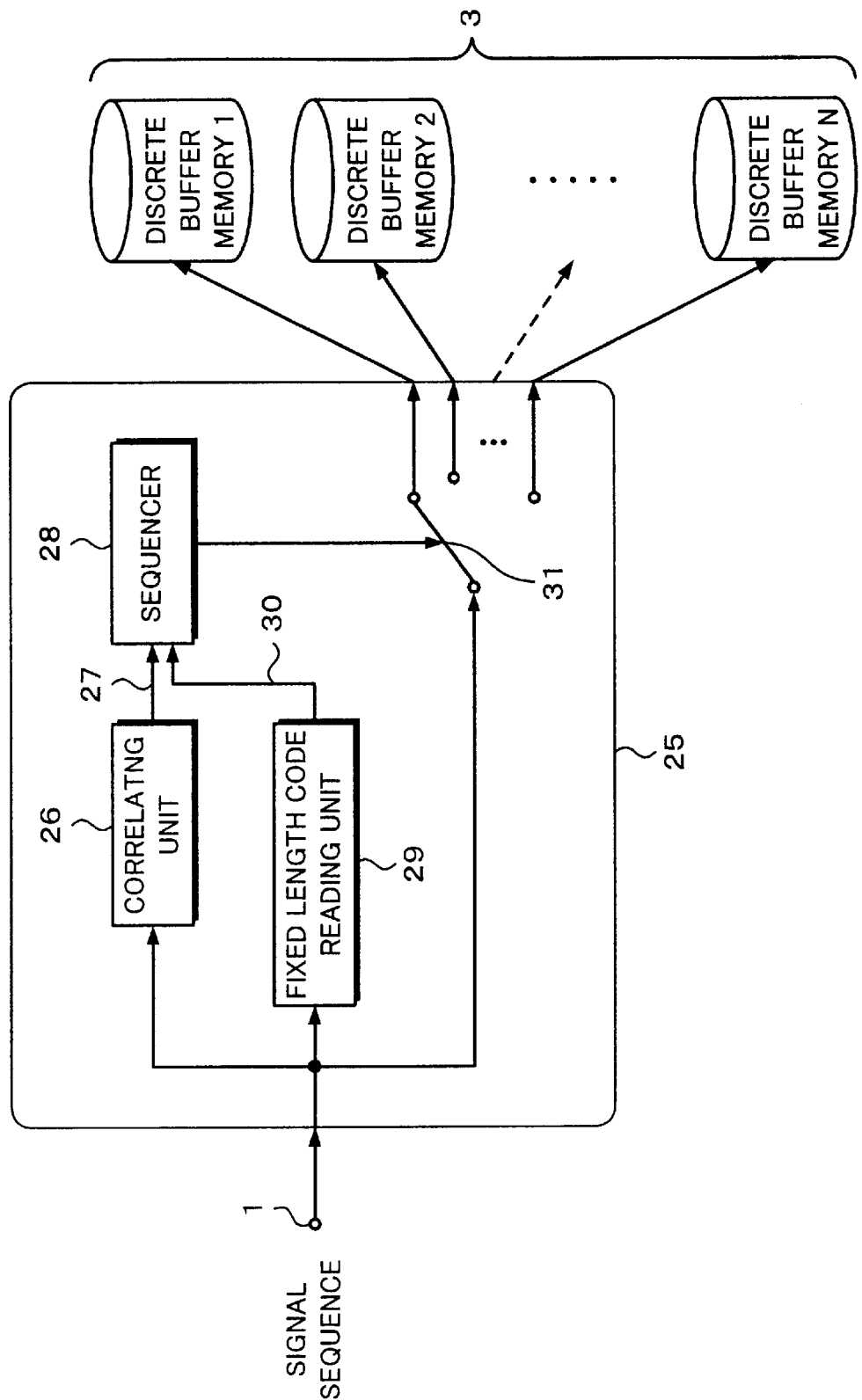
FIG. 13 is a block diagram showing another example of the structure of the pre-processing unit according to the present invention.

Next, the structure and operation of the code decoding apparatus that decodes the signal sequence with the above-described structure will be described. FIG. 13 shows the structure of a pre-processing unit. In FIG. 13, an encoded signal sequence with the above-described structure is supplied to a pre-processing unit 25 through an input terminal 1. The pre-processing unit 25 is composed of a correlating unit 26, a fixed length code reading unit 29, a sequencer 28, and a writing buffer selector 31. The signal sequence received through the input terminal 1 is supplied to the correlating unit 26, the fixed length code reading unit 29, and an input terminal of the buffer selector 31.

The correlating unit 26 detects the slice start code 22 that is a specifically fixed length code of the signal sequence and outputs a slice start code detection signal 27 to the sequencer 28. The sequencer 28 causes the fixed length code reading unit 29 to decode the slice vertical position code 23 that is a fixed length code preceded by the slice start code 22 and obtains a slice vertical position 30. The sequencer 28 generates control information with the slice start code detection signal 27 and the slice vertical position 30. The control information is supplied to the selector 31. The selector 31 selects buffer memories of a memory portion 3 corresponding to the control information received from the sequencer 28. Thus, a signal sequence preceded by the slice vertical position code 23 is written to an m-th buffer memory of the memory portion 3 selected by the writing buffer selector 31.

A process at a particular point is defined by the following expression (1).

$$m = \text{slice vertical position} \% N + 1 \qquad (1)$$

where % represents a remainder operator.

After a predetermined time period elapses or when the total capacity of signal sequences stored in the N buffer memories of the memory portion 3 exceeds a predetermined capacity, signal sequences are successively read from the N buffer memories. The plurality of signal sequences are supplied to a pipelined decoding unit shown in FIG. 14.

Figure 14:
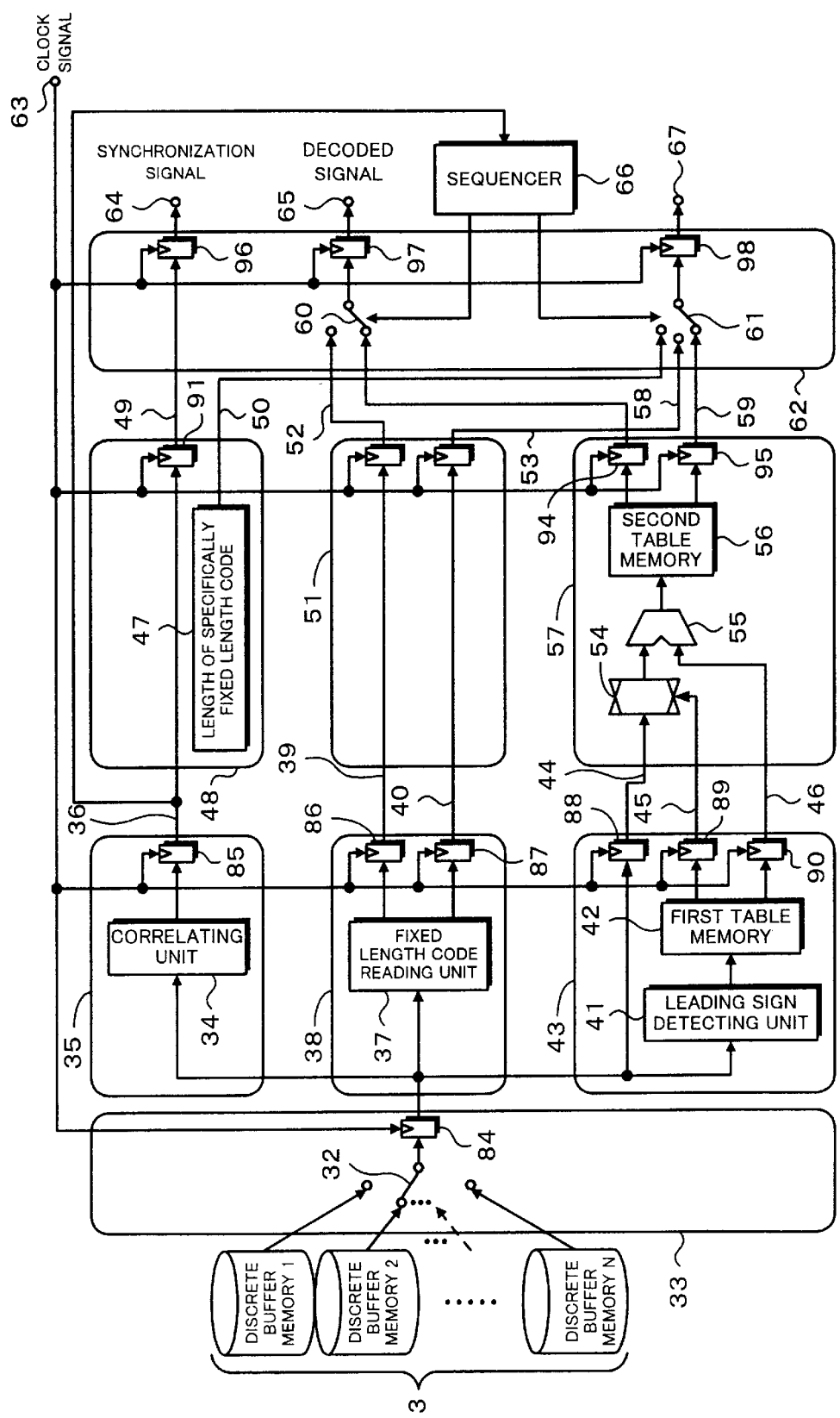
FIG. 14 is a block diagram showing a pipelined decoding unit according to the present invention.
Figure 15:
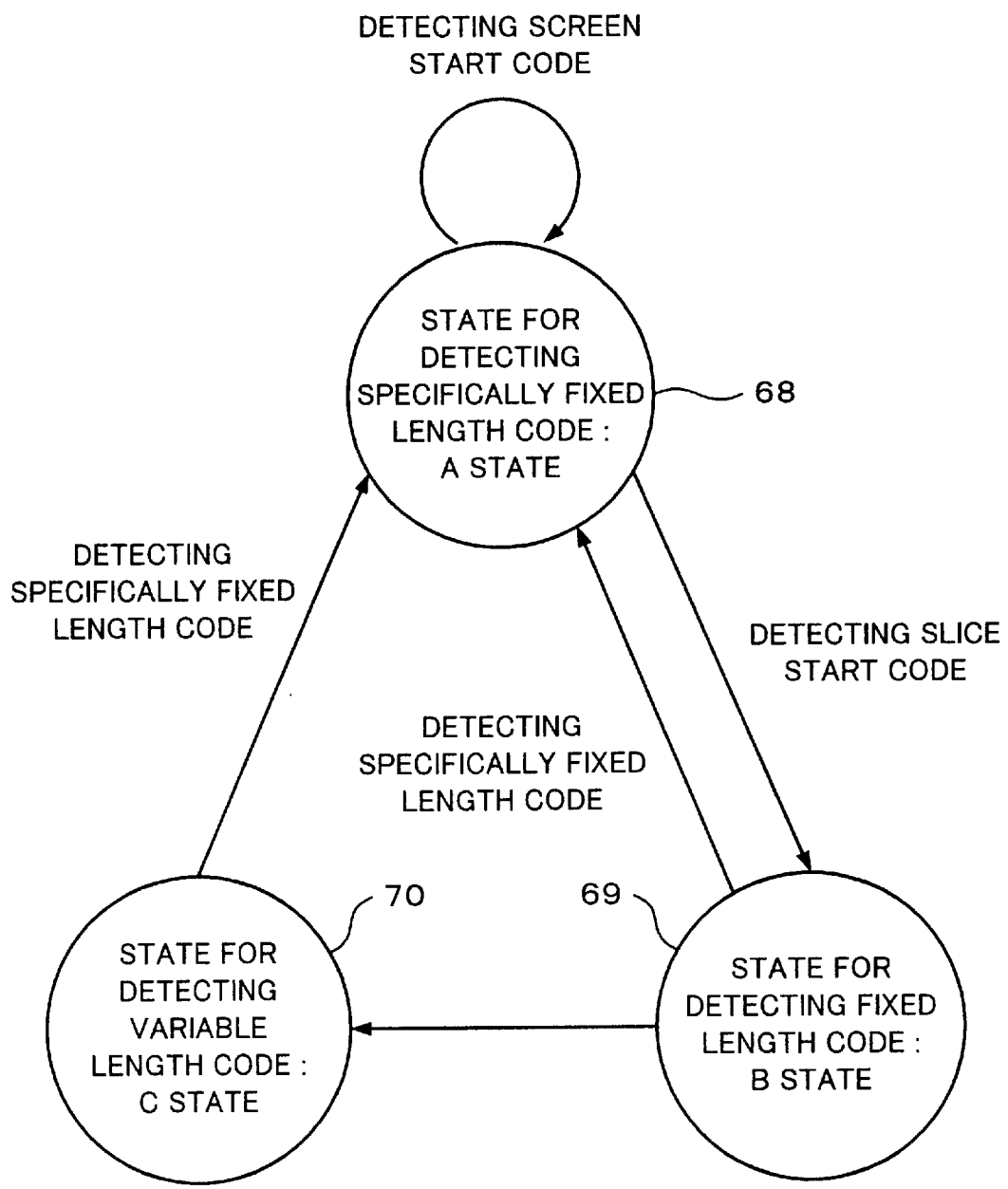
FIG. 15 is a state diagram for explaining the operation of the pipelined decoding unit according to the present invention.

FIG. 14 shows the structure of a pipelined decoding unit. FIG. 15 is a state diagram of the pipelined decoding unit. As shown in FIG. 15, the pipelined decoding unit has three states that are an A state 68, a B state 69, and a C state 70. The A state 68 is a state for detecting a specifically fixed length code. The B state 69 is a state for detecting a fixed length code. The C state 70 is a state for detecting a variable length code.

In the pipelined decoding unit, N time slots are assigned, corresponding to N buffer memories, on time axis. The decoding unit performs a decoding process on each stage in the pipeline at a timing of each time slot in synchronization with a clock signal received through a terminal 63. Processes of the pipelined decoding unit are largely categorized as four stages that are an A stage, a B stage, a C stage, and a D stage. When the processes on the four stages are successively performed, the decoding process is completed. Between two stages of the four stages, pipeline processing registers 84 to 98 are disposed. At a timing of a leading edge of the clock signal supplied to a clock input terminal of each of the registers 84 to 98 through the terminal 63, a signal sequence is supplied. Thus, data of each process is settled.

On the A stage 33, a reading buffer selector 32 successively selects one of the N buffer memories and reads signal sequences stored therein. At this point, the signal sequences that are read from the buffer memories are not discarded. The signal sequences are actually discarded on the D stage 62.

On the B stage, there are three sub-stages a B0 stage 35, a B1 stage 38, and a B2 stage 43. The B0 stage 35 always operates. The B1 stage 38 and the B2 stage 43 perform processes corresponding to the state of the current time slot.

On the B0 stage 35, a correlating unit 34 detects the screen start code 21 or the slice start code 22 that is a specifically fixed length code from the signal sequence and outputs the detected code as a synchronization signal 36 to the next stage.

The B1 stage 38 operates in the case that the state of the current time slot is the B state 69. A fixed length code reading unit 37 reads the slice vertical position code 23 as a fixed length code from the signal sequence and outputs a slice vertical position 39 and a code length 40 to the next stage.

The B2 stage 43 operates in the case that the state of the current time slot is the C state 70. A leading sign detecting unit 41 detects the length of successive codes from the signal sequence and reads a feature of a variable length code group corresponding to the length of the detected successive codes from a first table memory 42. The first table memory 42 stores the lengths of the minimum variable length code and the maximum variable length code as features of the variable length code group and another equivalent code group (for example, an offset address of a second table memory 56 that stores a fixed length code group). The leading sign detecting unit 41 outputs a part 44 of the signal sequence, the maximum/minimum code lengths 45 of the variable length code group, and the offset address 46 of the second table memory 56 to the next stage.

On the C stage, there are also three sub-stages a C0 stage 48, a C1 stage 51, a C2 stage 57. The C0 stage 48 operates only when the synchronization signal is received from the B0 stage 35. On the C1 stage 51 and the C2 stage 57, a process corresponding to the state of the current time slot is performed.

On the C0 stage 48, the synchronization signal 49 is output to the next stage. In addition, a specifically fixed length code length 47 is output as a code length 50 to the next stage.

The C1 stage 51 operates in the case that the state of the current time slot is the B state 69. On the C1 stage 51, a slice vertical position 52 and a code length 53 of a fixed length code are output to the next stage.

The C2 stage 57 operates in the case that the state of the current time slot is the C state 70. A shifter 54 cuts the part 44 of the signal sequence at the position represented by the minimum/maximum code lengths 45 of the variable length code group that is read from the first table memory 42. An adding unit 55 adds the part 44 and the offset address 46 of the second table memory 56. A code length 59 of the variable length code obtained from the second table memory 56 corresponding to the calculated address and another equivalent code (for example, a fixed length code) are output as encoded block information 58 to the next stage.

On the D stage 62, a decoded signal selector 60 selects the slice vertical position 52 as a decoded signal in the case that the state of the current time slot is the B state 69. The decoded signal selector 60 selects decoded block information 58 as a decoded signal in the case that the state of the current time slot is the C state 70. The decoded signal is output to the processing unit on the next stage. In addition, a code length selector 61 selects the code length 50 of the specifically fixed length code as a code length when the synchronization signal is received from the C0 stage 48. The code length selector 61 selects the code length 53 of the fixed length code as a code length in the case that the state of the current time slot is the B state 69. The code length selector 61 selects the code length 59 of the fixed length code as a code length 67 in the case that the state of the current time slot is the C state 70. The signal sequence with the code length 67 is discarded from the m-th buffer memory. When the synchronization signal is received from the C0 stage 48, the synchronization signal is output to the processing unit on the next stage.

When the processes on the A stage 33, the B stage (35, 38, and 43), the C stage (48, 51, and 57), and the D stage 62 are repeatedly pipelined, the decoding process is performed. In reality, corresponding to the processing amount, more stages may be required. In this case, required stages are added. Moreover, in the processing unit on the next stage, for example, a plurality of processors are disposed so as to process a plurality of decoded codes.

The B state 69 and the C state 70 on each stage change as shown in FIG. 15. The state transition is controlled by the sequencer 66. The sequencer 66 performs a synchronizing process and a state transition process corresponding to a specifically fixed length code detected on the B0 stage 35.

The A state 68 takes place initially. In the A state 68, a specifically fixed length code is detected. When the screen start code 21 is detected as a specifically fixed length code, the A state remains unchanged. When the slice start code 22 is detected as a specifically fixed length code, the A state changes to the B state 69. In any condition, when a specifically fixed length code is detected, the current state restate returns to the A state 68.

The B state is a state for decoding a fixed length code. After a particular fixed length code is decoded corresponding to the syntax of a signal sequence, the B state 69 changes to the C state 70. The C state is a state for decoding a particular variable length code. These states take place corresponding to the number of time slots (namely, the number of buffer memories). Each time slot corresponds to one of the N buffer memories. Of course, instead of the above-described decoding unit, a plurality of decoding units may be pipelined.

As described above, according to the code decoding apparatus of the present invention, a variable length code decoding unit can be operated in parallel or in pipeline. Thus, the variable length code decoding unit can be operated at high speed. In other words, a code decoding apparatus having a general-purpose variable length code converting circuit can be practically accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A code decoding apparatus for converting a signal sequence having a variable length code, a fixed length code, and a specifically fixed length code into other equivalent codes, a synchronizing process and a syntax analyzing process being performed corresponding to the specifically fixed length code, the apparatus comprising:

a correlating unit for detecting a specifically fixed length code from the signal sequence;

distributing means for successively distributing the signal sequence preceded by the detected specifically fixed length code to a plurality of code decoding units; and decoding means for causing the code decoding units to decode the signal sequence.

2. A code decoding apparatus for temporarily writing a signal sequence having a variable length code, a fixed length code, and a specifically fixed length code to a buffer memory, reading a signal sequence from the buffer memory, and converting the signal sequence into another equivalent code, a synchronizing process and a syntax analyzing process being performed corresponding to the specifically fixed length code, the apparatus comprising:

detecting means for detecting a specifically fixed length code from the signal sequence;

a plurality of discrete buffer memories;

selecting means for selecting a particular one of said plurality of discrete buffer memories; and writing means for writing the signal sequence to the selected discrete buffer memory until the next specifically fixed length code is detected.

3. The code decoding apparatus as set forth in claim 2, further comprising:

reading means for reading signal sequences from said plurality of discrete buffer memories in parallel; and decoding means for causing a code decoding circuit having a plurality of variable length code decoding units to decode the signal sequences that are read by said reading means.

4. The code decoding apparatus as set forth in claim 2, further comprising:

reading means for successively reading signal sequences from said plurality of discrete buffer memories in time series; and decoding means for causing a code decoding circuit having at least one pipelined variable length code decoding unit to decode the signal sequences.

5. A code decoding apparatus for receiving a signal sequence composed of a plurality of block groups, each block group including horizontally or vertically successive blocks, each block comprising Bw×Bh pixels, in a matrix; a specifically fixed length code; a fixed length code representing the horizontal or vertical position of the first block of each block group; and pixel data of each block group being encoded with variable length codes sequentially, the apparatus comprising:

a correlating unit for detecting a specifically fixed length code from the signal sequence;

reading means for reading a value of a fixed length code representing a horizontal position or a vertical position of a first block of each block group;

a plurality of discrete buffer memories;

selecting means for selecting a particular discrete buffer memory from said plurality of discrete buffer memories corresponding to the horizontal position or the vertical position of the block group that is read by said reading means; and writing means for writing a signal sequence to the selected discrete buffer memory until the next specifically fixed length code is detected.

6. The code decoding apparatus as set forth in claim 5, further comprising:

reading means for successively reading signal sequences from said plurality of discrete buffer memories in the time series; and decoding means causing a code decoding circuit having at least one variable length code decoding unit to decode the signal sequences.

7. The code decoding apparatus as set forth in claim 6, wherein said variable length code decoding unit comprises;

a correlating unit for detecting a specifically fixed length code from the signal sequences that are read from the signal sequences that are read from said plurality of discrete buffer memories;

reading means for reading the fixed length code;

detecting means for detecting a length of successive codes;

address generating means for generating an address with the length of the successive codes that are detected and a part of the signal sequences that are read;

a table memory for storing a length of a variable length code corresponding to an address and another equivalent code; and reading means for reading a length of the variable length code and the other equivalent code from said table memory.

* * * * *